(12) United States Patent
Peels et al.

(10) Patent No.: US 6,573,821 B2
(45) Date of Patent: Jun. 3, 2003

(54) SYSTEM, PRINTED CIRCUIT BOARD, CHARGER DEVICE, USER DEVICE, AND APPARATUS

(75) Inventors: Wilhelmus Gerardus Maria Peels, Eindhoven (NL); Hassan Barakat El, Eindhoven (NL); Hendricus Theodorus Vos, Eindhoven (NL); Jan Van Laar, Nuenen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 26 days.

(21) Appl. No.: 09/989,243

(22) Filed: Nov. 20, 2001

(65) Prior Publication Data
US 2002/0075116 A1 Jun. 20, 2002

(30) Foreign Application Priority Data
Nov. 21, 2000 (EP) .............................. 00204112

(51) Int. Cl.[7] ................................. H01F 5/00
(52) U.S. Cl. ...................... 336/200; 336/223; 336/232
(58) Field of Search ................ 336/200, 223, 336/232

(56) References Cited

U.S. PATENT DOCUMENTS

| | | | | |
|---|---|---|---|---|
| 5,430,424 A | * | 7/1995 | Sato et al. | 336/200 |
| 5,565,837 A | * | 10/1996 | Godek et al. | 336/232 |
| 5,631,822 A | * | 5/1997 | Silberkleit et al. | 363/144 |
| 5,990,776 A | * | 11/1999 | Jitaru | 336/200 |
| 6,369,685 B1 | * | 4/2002 | Milavec et al. | 336/232 |
| 6,448,879 B1 | * | 9/2002 | Kitamura | 336/200 |
| 6,459,351 B1 | * | 10/2002 | Maki et al. | 336/200 |

OTHER PUBLICATIONS

O. Dezuair et al., Sensors and Actuators A, 76 (1999), pp. 349, 355.

* cited by examiner

*Primary Examiner*—Anh T Mai

(57) ABSTRACT

A printed circuit board (10) including a layered transformer (1) has a stack of layers of a first magnetic layer (2), a first transformer coil (4), an insulating body (7), a second transformer coil (5) and a second magnetic layer (3), wherein each of the transformer coils (4, 5) is embodied as a two-dimensional pattern of conductive tracks. The insulating body may comprise one of more channels (8, 18, 28) containing a magnetic material. Instead of one printed circuit board (10), the transformer (1) may be embodied in two printed circuit boards (60) as well, each comprising a magnetic layer (2) and a transformer coil (4). Said printed circuit boards may be included in a charger device (71) and a user device (72).

17 Claims, 5 Drawing Sheets

SYSTEM, PRINTED CIRCUIT BOARD, CHARGER DEVICE, USER DEVICE, AND APPARATUS

FIELD OF TECHNOLOGY, BACKGROUND, AND SUMMARY

The invention relates to a system comprising a transformer which has a first and a second transformer winding and a first magnetic layer, which first magnetic layer is laminated in a multilayer printed circuit board, said printed circuit board being provided with a first and a second, opposed outer surface with a pattern of conductor tracks on the first outer surface.

The invention also relates to a printed circuit board provided with a first and a second, opposed outer surface, with a pattern of conductor tracks on said first outer surface, printed circuit board which comprises a first transformer winding and a first magnetic layer.

The invention further relates to a charger device, a user device, and an apparatus, all suitable for use in the system.

Such a system and such a printed circuit board are known from O. Dezuari et al., *Sensors and Actuators* A, 76(1999), pp. 349–355. The known printed circuit board comprises a magnetic layer with an alloy of CoFeMo as the magnetic material. This alloy is provided on a substrate of epoxy resin by means of a liquid epoxy or acrylic acid glue. The magnetic layer is patterned so as to form a rectangular or toroidal magnetic core. Between the substrate with the alloy and the outer surfaces of the printed circuit board there are epoxy resin boards which are provided with conductor track patterns at the outer surfaces. Conductor tracks at the first outer surface and at the second outer surface are interconnected with electrical conduction by means of vias. A turn of a transformer winding is formed by a conductor track on the first outer surface, a conductor track on the second outer surface, and the two vias between these conductor tracks. The turn thus lies in a plane which is substantially perpendicular to the plane of the first magnetic layer. If the magnetic layer is patterned so as to have a rectangular shape, the turns, and also the first and the second transformer winding, will be mutually parallel. The transformer windings thus form three-dimensional patterns which are coiled around the magnetic core or around a portion of the magnetic core which is constructed as a layer.

A disadvantage of the known system is that the transformer has a self-inductance of no more than 1 to 10 microHenries and is useful up to 30 kHz. The known printed circuit board is accordingly not suitable for the transfer of powers in switch mode power supplies.

It is a first object of the invention to provide a system of the kind mentioned in the opening paragraph which is suitable for the transfer of power in switch mode power supplies.

It is a second object of the invention to provide a printed circuit board of the kind mentioned in the opening paragraph which is suitable for the system according to the invention.

Further objects of the invention are the provision of a user device, a charger device, and an apparatus suitable for the system according to the invention.

The first object is achieved in that
the transformer comprises a primary part, a secondary part, and an insulation layer, which insulation layer lies between the primary and the secondary part,
the primary part comprises the first transformer winding and the first magnetic layer, which first transformer winding is constructed as a two-dimensional pattern of conductor tracks, is laminated in the printed circuit board between the first magnetic layer and the insulation layer, and is electrically connected to the pattern of conductor tracks at the first outer surface, and
the secondary part comprises the second transformer winding and a second magnetic layer, which second transformer winding lies between the second magnetic layer and the insulation layer.

The transformer in the system according to the invention differs constructionally from the transformer in the known system. Thus a second magnetic layer is present besides the first in the system according to the invention. Furthermore, the first and the second transformer winding lie in a plane which is substantially parallel to the magnetic layers. In addition, the first and the second transformer winding are present between the first and the second magnetic layer.

It is found that the transformer in the system according to the invention is capable of generating a sufficiently strong magnetic field. The self-inductance of the transformer in the system according to the invention is 1 to 10 milliHenries, i.e. a factor 1000 better than in the transformer in the known system. In addition, the transformer in the system according to the invention can be used with frequencies up to a few hundreds of kHz. A coupling of 0.95 or higher is realized with lateral dimensions of a few square centimeters, with a Q-factor of the order of 10 to 40. Accordingly, the system according to the invention is highly suitable for power transfer in switch mode power supplies.

The system according to the invention may comprise a printed circuit board in which both the primary and the secondary part have been laminated. The transformer in the system, however, also operates if the primary and the secondary part are kept at some distance from one another, highly preferably substantially parallel to one another. The primary part may thus be integrated into a charger device, and the secondary part may be integrated into a user device. The user device may be charged by means of the charger device in a contactless manner in the system according to the invention.

Such a system for contactless charging is used inter alia in electric tooth brushes. This known system comprises, besides an electric tooth brush in which a battery and a coil are present, also a charger device with a coil. The charger device is provided with a ring in which the user device can be placed. The contactless charging operation takes place by the air coil principle; when the user device is placed in the ring of the charger device, the coils are concentric and transfer of energy can take place through the air. It is a disadvantage of the known system that dissipation of energy takes place also when the user device is not placed in the ring. This is undesirable for economic and environmental reasons. This disadvantage is obviated in the system according to the invention. Whereas the known system for contactless charging achieves a coupling of no more than 38%, the system according to the invention is capable of realizing a coupling of 95% or higher. When the user device is not present on the charger device, the power dissipated by the first transformer winding is small. The surface area of a turn in the transformer winding is in fact comparatively small, and the turns are preferably thin. In addition, the construction with transformer windings and magnetic layers which are mutually substantially parallel leads to a transformer which is more efficient than the transformer in the known system.

It is not necessary in the system according to the invention for a printed circuit board to be present both in the charger device and in the user device, in which printed circuit board a layered magnetic layer and a transformer winding constructed as a two-dimensional pattern of conductor tracks have been integrated. In a favorable embodiment, the magnetic layer in the user device is constructed as a component which is placed on the printed circuit board, and the transformer winding is present at the outer surface of the printed circuit board. The charger device then may have a larger surface area than the user device; several user devices may be charged with one and the same charger device contactlessly and simultaneously in this manner. In addition, the charger device may be integrated in an object such as, for example, a fruit bowl or a shelf in a bathroom cabinet. A charger device is regarded as an untidy item by many consumers. The integration of the charger device in an object such as a fruit bowl renders the charger device invisible while at the same time making it readily available for use.

Examples of user devices according to the invention are inter alia an electric tooth brush, an electric shaver, a mobile telephone, a portable computer, portable kitchen equipment, an electric thermometer, a watch, and an electric alarm clock.

If the transformer forms part of a supply circuit, at least two topologies are known for the construction of the circuit, i.e. a flyback topology and a resonant topology. It was found in experiments that the transformer may be used both in a circuit with flyback topology and in a circuit with resonant topology, also known to those skilled in the art as a resonant switch mode power supply. Preferably, the transformer forms part of a circuit which is designed as a resonant topology such as, for example, a half bridge. Less power dissipation takes place because the power which would be dissipated owing to the scattering self-induction is utilized by a capacitor for generating the resonant, sinusoidal current curve, as is familiar to those skilled in the art. The transformer in the system according to the invention may thus also be used at higher powers, of more than approximately 50 W.

The second object of the invention is achieved in that the first magnetic layer, the first transformer winding constructed as a two-dimensional pattern of conductor tracks, and an insulating layer are laminated between the first and the second outer surface, while the first transformer winding is connected with electrical conduction to the pattern of conductor tracks at the first outer surface. The object is achieved thereby, i.e. that the printed circuit board is suitable for use in the system as claimed in claim 1 or 2. It is to be understood, that the term "printed circuit board" also includes any other type of multilayer substrate, such as a low-temperature cofiring ceramic (LTCC) substrate.

Preferably, a second transformer winding constructed as a two-dimensional pattern of conductor tracks and a second magnetic layer are present between the insulating layer and the second outer surface, and the second transformer winding and the second magnetic layer are laminated together with the insulating layer, the first transformer winding, and the first magnetic layer.

The transformer in this embodiment is of a completely layered construction. As a result, it can be manufactured in a simple manner. An advantage of the printed circuit board according to the invention over a printed circuit board on which a plurality of components have been provided is that the former is very thin. To achieve a minimum thickness, preferably, other components are also integrated in the printed circuit board, i.e. between the magnetic layers and the outer surfaces. The two-dimensional pattern of the transformer windings is preferably spiraling in shape.

The first magnetic layer comprises a magnetic material. This material may be, inter alia, ferrite, iron, or an iron alloy, or some other magnetic alloy, and may take the form of, inter alia, a layer or a distributed powder. Among the examples of alloys are NiFe, CoFe, MnFe, and CoFeMo.

In an advantageous embodiment, the first magnetic layer comprises a composite of a matrix of organic material and a filler of magnetic material. The properties of the transformer are found to be good in spite of the relative magnetic permeability of the composite being no more than 20. It was found in addition that the transformer also operates satisfactorily if an insulating layer is chosen which complies with the European standards for mains separation layers and no interconnections of magnetic material are present in the insulating layer.

The composite has a number of advantages here: it can be manufactured in a separate process and has a low cost price. The composite can be very well laminated together with other layers in the printed circuit board according to the invention. Furthermore, a layer of the composite may serve as a substrate for a pattern of conductor tracks. Preferred materials for the matrix are epoxides and polyesters, as well as other materials which are used for printed circuit boards. In principle, the magnetic materials known to those skilled in the art are suitable as fillers for the composite. If the transformer is used at lower frequencies of up to approximately 5 MHz, ferrite is preferably used as the filler. Iron or iron-containing particles are preferred for higher frequencies. By further preference, the filler is used in a density of more than 50% by volume. It is particularly favorable when not only the first magnetic layer, but also the second magnetic layer comprises the composite of a matrix with a filler of magnetic material.

In an alternative embodiment, a screening layer of electrically conducting material and an intermediate layer of electrically insulating material are present at the first outer surface between the first magnetic layer and the pattern of conductor tracks. The screening layer of electrically conducting material screens off the conductor tracks at the surface and components placed on the surface or integrated in the printed circuit board from the magnetic field of the transformer. Several materials may be chosen as the electrically conducting material, such as copper, aluminum, silver, a metal-filled epoxy resin, and an electrically conducting oligomer or polymer. Examples of suitable oligomers or polymers are inter alia doped polyaniline and doped polythiophene, which may possibly be substituted with optional cyclic $C_1$–$C_{10}$-alkyl or alkoxy substituents. Preferably, the electrically conducting material has a conductivity of at least 100 S/cm.

It is particularly favorable when a screening layer of electrically conducting material and an intermediate layer of electrically insulating material are also present between the second magnetic layer and the second outer surface of the printed circuit board. Conductor tracks and components may thus be present at the second outer surface or be integrated in the printed circuit board without an accompanying interference from the magnetic field. The entire secondary circuit may be present in or on the printed circuit board.

Preferably, the insulating layer in the printed circuit board according to the invention is very thin. Transformer losses owing to a parasitic magnetic flux through the insulating layer, only around the first or the second transformer winding, are limited as much as possible then. Alternatively, the insulating layer may have a thickness of at least 0.4 mm and projects at least 2.5 mm beyond the magnetic layers. This complies with the European requirements as regards mains separation layers between a primary and a secondary circuit, especially if the first transformer winding is directly or indirectly connected to the mains. These requirements stipulate that a creepage path over solid surfaces of at least 5 microns is required, and an air path of at least 5 mm. These requirements are complied with in this embodiment of the printed circuit board without the dimensions of the transformer or of the printed circuit board being appreciably increased. Alternatively, further electrically insulating layers may be present in addition to the insulating layer, for example a total of three layers. The total thickness of the insulating layer may be limited, for example to 0.15 mm, provided two layers together comply with a test voltage of 4240 Vdc.

It is an advantage of the use of several insulating layers that they are highly suitable for providing patterns of conductor tracks thereon. If a pattern of conductor tracks is to be provided on either side of the insulating layer, two printed circuit boards each provided with a pattern of conductor tracks on one side only may be laminated. It is also favorable to use several insulating layers if the printed circuit board is to be detachable, i.e. is to be separable into two parts.

In an alternative embodiment, the insulating layer is provided with channels (or through holes), which channels are filled with a composite comprising a matrix of organic material and a filler of magnetic material. The presence of such filled channels leads to a transformer which is not separated from the mains. Losses owing to the parasitic magnetic fluxes are further reduced thereby. Moreover, the channels may be filled with magnetic material without an air path of less than 5 mm arising. Holes are provided in the insulating layer for this purpose, which layer comprises, for example, a cured epoxy resin. Then a layer of the composite is provided, which is not yet cured. When subsequently the printed circuit board is laminated under pressure, the holes are filled through the flow of the composite.

If the voltage is to be sufficiently transformed with a single transformer, it is necessary for the number of turns in the primary circuit to be large compared with the number in the secondary circuit, or vice versa in the case of transformation to a higher voltage. In a further embodiment, therefore, a third transformer winding in the form of a two-dimensional pattern of conductor tracks is present between the first transformer winding and the insulating layer, which third transformer winding is electrically connected to the first transformer winding. Since the first and the third transformer winding are interconnected and arranged in parallel, the number of turns in the primary circuit is doubled. Obviously, a fourth and a fifth transformer winding may also be provided and connected to the first transformer winding so as to increase the number of turns still further. The manufacture of an electrically conducting connection or via through a layer of the printed circuit board is known to those skilled in the art of printed circuit boards.

Thanks to its small thickness, the printed circuit board according to the invention may be used to advantage in a plurality of domestic and electronic devices. Furthermore, it is highly suitable for use in displays, such as liquid crystal displays, flat panel displays, and other displays in which a voltage is to be transformed in upward direction, on account of its very small thickness.

BRIEF DESCRIPTION OF THE DRAWING FIGURES

These and other aspects of the system, the printed circuit board, the charger device, and the user device according to the invention will be explained in more detail with reference to drawings and embodiments, which should not be construed as representing any limitation and wherein.

DETAILED DESCRIPTION

Figure 1:
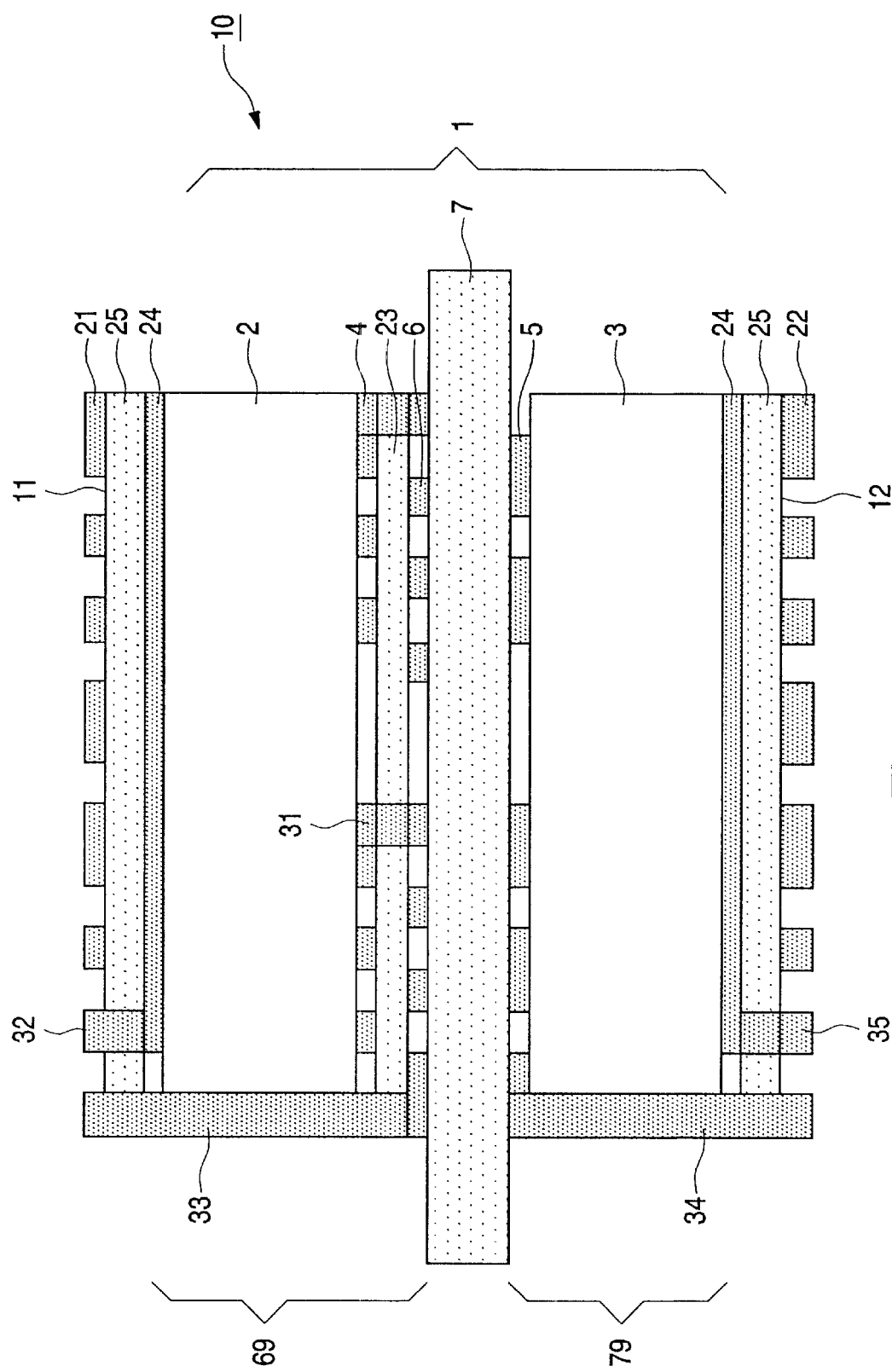
FIG. 1 is a diagrammatic cross-sectional view of a first embodiment of the printed circuit board.

The figures are diagrammatic and not true to scale, and identical reference numerals relate to corresponding components. It will be clear to those skilled in the art that alternative but equivalent embodiments of the invention are possible without departing from the essence of the invention, and that the scope of the invention is limited by the claims only. It will also be clear to those skilled in the art that the number of turns of the transformer windings as drawn has been limited to no more than two, three, and four for the sake of clarity.

FIG. 1 shows a first embodiment of the printed circuit board 10 which is provided with a first outer surface 11 and a second, opposed outer surface 12. Patterns of conductor tracks 21, 22 are present at the first outer surface 11, and also at the second outer surface 12 in this embodiment. The printed circuit board 10 further comprises a stack of a first magnetic layer 2, a first transformer winding 4, a third transformer winding 6, an insulating layer 7, a second transformer winding 5, and a second magnetic layer 3. This stack constitutes the transformer 1; the first magnetic layer 2 and the first and third transformer windings 4, 6 together forming the primary part 69. The second transformer winding 4 and the second magnetic layer 3 together form the secondary part 79 here. The third transformer winding 6 is present between an electrically insulating layer 23 and the insulating layer 7. Said layer 23 preferably is a printed circuit board of a known material such as FR-4. The third transformer winding 6 is in fact an enlargement of the first transformer winding 4 and is connected thereto by means of a via 31 through the layer 23. The first transformer winding 4 is connected to the pattern of conductor tracks 21 by means of a via 33 and the third transformer winding 6. The transformer windings 4, 5, and 6 each have a number of copper turns provided with an electrically insulating sleeve. If the transformer 1 is to transform the voltage down, the first and third transformer windings 4, 6 together form the primary transformer winding; the second transformer winding 5 will form the secondary transformer winding.

The first and the second magnetic layer 2, 3 in this embodiment comprise a composite of a matrix of an organic material and a filler of magnetic material. The organic material is epoxy resin, the magnetic material a powdered ferrite. The density of the ferrite is 50% by volume, and the relative magnetic permeability of the composite is 20. The thickness of the layer preferably lies between 800 and 1200 microns. The transformer 1 as a result has a self-inductance of between 1 and 10 mH. The insulating layer 7 in this embodiment consists of a substantially closed layer of electrically insulating material, such as an epoxy prepreg or an epoxy laminate with a thickness of 0.4 mm. The insulating layer 7 projects 2.5 mm beyond the first and the second magnetic layer 2, 3. It thus complies with the requirements obtaining in Europe as regards mains separation layers, so that it is allowed to connect the primary transformer winding directly to the mains.

In the first embodiment, the printed circuit board 10 comprises a screening layer 24 of copper and an intermediate layer 25 of an electrically insulating material, such as a FR-4 laminate, between the first outer surface 11 and the first magnetic layer 2. The intermediate layer 25 at the same time is the carrier for the pattern of conductor tracks 21, which have been patterned in a usual manner. The intermediate layer 25 may also be the carrier of the screening layer 24. Preferably, however, the screening layer 24 is provided on the first magnetic layer 2. Metallized holes or vias 32, 33 are provided in the intermediate layer 25, ensuring the connection of the first transformer winding 4 and the screening layer 24 to components, the mains, or ground. As those skilled in the art will understand, a via is present between the third transformer winding 6 and the pattern of conductor tracks 21 in addition to the via 33 to the first transformer winding 4. A screening layer 24 and an intermediate layer 25 with vias 34, 35 are also provided between the second outer surface and the second magnetic layer. 3.

Figure 2:
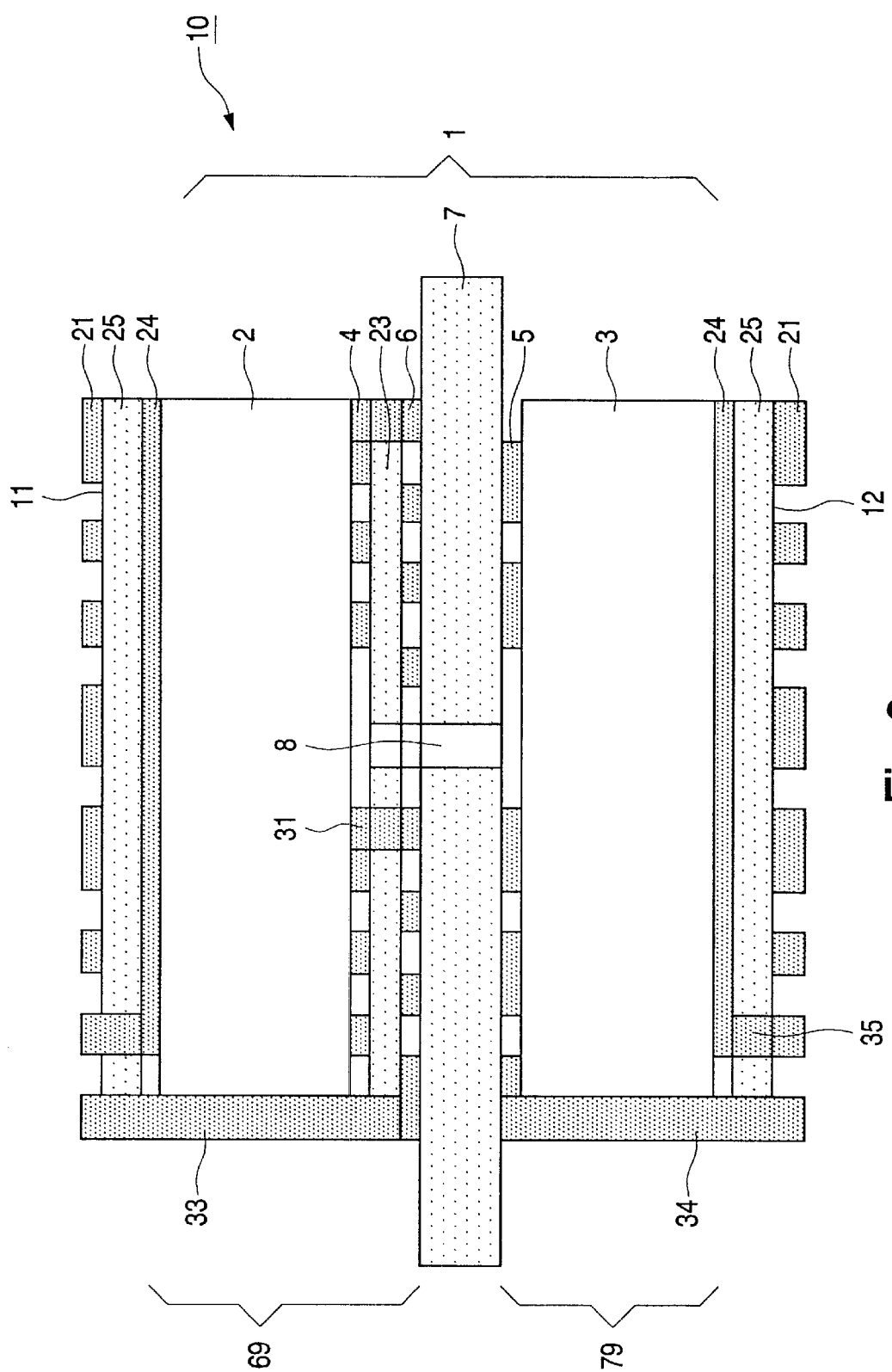
FIG. 2 is a diagrammatic cross-sectional view of a second embodiment of the printed circuit board.

FIG. 2 shows a second embodiment of the printed circuit board 10. The insulating layer 7 and the intermediate layer 23 comprise a channel 8 which is filled with a composite of a matrix of organic material and a filler of magnetic material. The magnetic material is ferrite and the organic material is an epoxy material. The channel 8 is manufactured in that a hole is made in the insulating layer 7 and the intermediate layer 23 in a usual manner. Then the composite is provided thereon, the epoxy still being in the liquid state. When subsequently the insulating layer 7, the first magnetic layer 2, the screening layer 24, the intermediate layers 23, 25, and the patterns of conductor tracks 4, 6, 21 are laminated under pressure, the liquid epoxy starts to flow and fills the channel 8. Since there is an excellent adhesion between the liquid epoxy in the channel 8 and the epoxy of the insulating layer 7, there will be no creepage path through the air along the edges of the channel. The transformer 10 with channel thus complies with the safety requirements set by European authorities.

Figure 3:
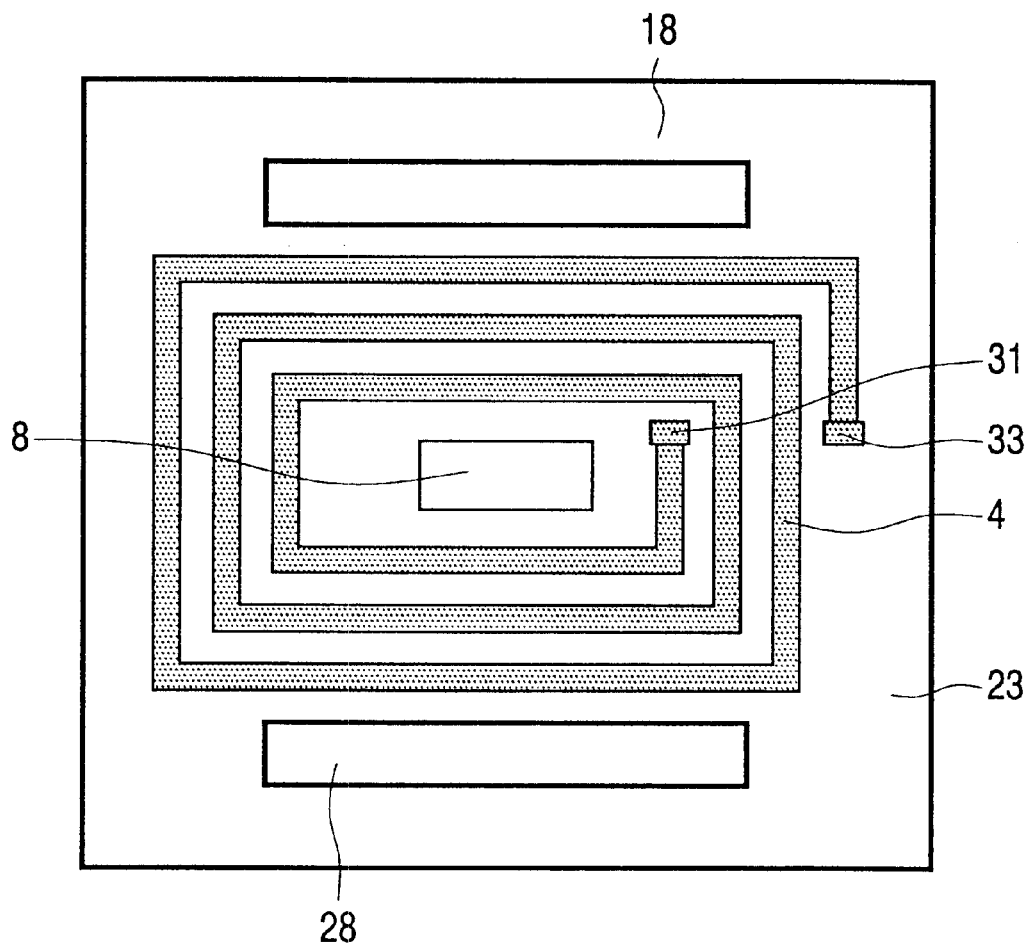
FIG. 3 is a diagrammatic plan view of the individual layers of the second embodiment.

FIG. 3 is a plan view of the individual layers of the second embodiment of the printed circuit board 10. The plan view is that of the first transformer winding 4. All layers situated between the first transformer winding 4 and the first outer surface 11 have been omitted. FIG. 3 shows that there are two more channels 18, 28 present in the intermediate layer 23 and the insulating layer 7 in addition to the channel 8. FIG. 3 further shows the first transformer winding 4 as well as the vias 33 and 31 at either end of the transformer winding 4. The presence of three channels creates a core of the transformer 10 which comprises the first and the second magnetic layer 2, 3 and the channels 8, 18, 28. A parasitic flux around the first and third transformer windings 4, 6 and through the first magnetic layer 2 and the insulating layer 7, or the intermediate layer 23, is limited thereby, because the resistance to the magnetic flux through the channels 8, 18, 28 is smaller than in other portions of the insulating layer 7 and the intermediate layer 23.

Figure 4:
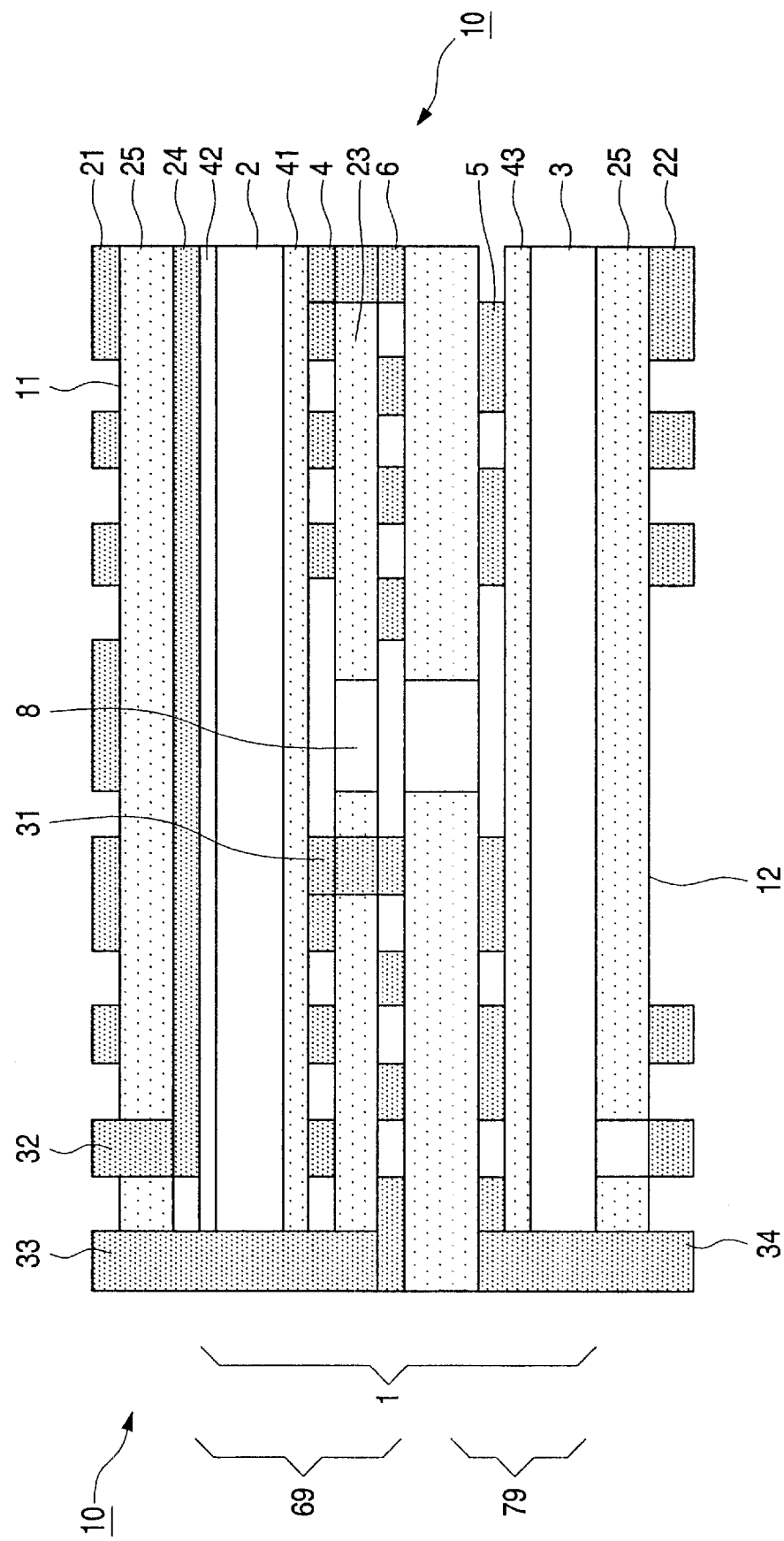
FIG. 4 is a diagrammatic cross-sectional view of a third embodiment of the printed circuit board.

FIG. 4 shows a third embodiment of the printed circuit board 10. In this embodiment, the first and the second magnetic layer 2, 3 comprise the magnetic material CoFeMo, which is commercially available in the amorphous state. It is an advantage of the material that it can be used as a thin layer of less than 100 microns. To protect the magnetic material, the first magnetic layer 2 lies between electrically insulating layers 41 and 42, and the second magnetic layer 3 lies between electrically insulating layers 43 and 25. The insulating layer 7 in this embodiment does not comply with the European safety requirements, which are not strictly necessary for other transformer types and for other countries. Preferably, a printed circuit board with a thickness of approximately 200 microns is used as the insulating layer. No screening layer 24 is present between the second magnetic layer 3 and the second outer surface 12 in the third embodiment.

Figure 5:
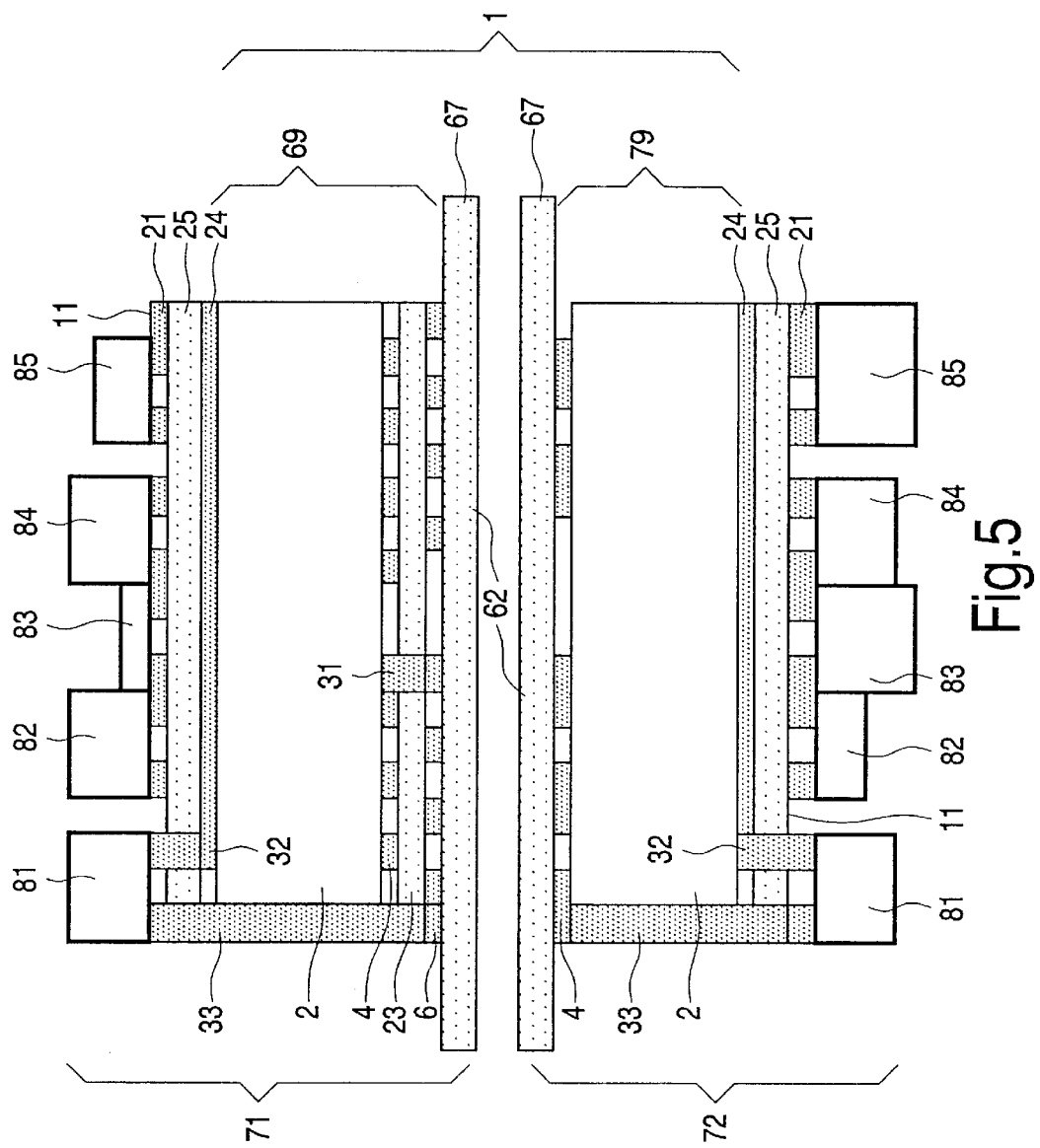
FIG. 5 is a diagrammatic cross-sectional view of the system.

FIG. 5 shows the system in a diagrammatic cross-sectional view. The system comprises a charger device 71 and a user device 72, of which devices 71, 72 the figure shows a few details only. The system further comprises a transformer 1 with a primary part 69 in the charger device 71 and a secondary part 79 in the user device 72.

A printed circuit board 60 with a first outer surface 11 and with a second outer surface 62 is present in the charger device 71. The printed circuit board 60 comprises an insulating layer 67, a first transformer winding 4, an intermediate layer 23, a further transformer winding 6, a magnetic layer 2, a screening layer 24, an intermediate layer 25, and a number of vias 31, 32, 33. The first and the further transformer winding 4, 6 are constructed as two-dimensional patterns of conductor tracks. A number of components 81, 82, 83, 84, 85 are fastened to the printed circuit board 60, at the first outer surface 11 thereof.

A printed circuit board 60 with a first outer surface 11 and with a second outer surface 62 is present in the user device 72 which is, for example, a mobile telephone. The printed circuit board 60 comprises an insulating layer 67, a transformer winding 4, a magnetic layer 2, a screening layer 24, an intermediate layer 25, and a number of vias 32, 33. The transformer winding 4 is constructed as two-dimensional patterns of conductor tracks. A number of components 81, 82, 83, 84, 85 are fastened to the printed circuit board 60, at the first outer surface 11 thereof.

What is claimed is:

1. A system comprising a transformer which has a first and a second transformer winding and a first magnetic layer, which first magnetic layer is laminated in a multilayer printed circuit board, said printed circuit board being provided with a first and a second, opposed outer surface with a pattern of conductor tracks on the first outer surface, characterized in that the transformer comprises a primary part, a second part, and an insulation layer, which insulation layer lies between the primary and the secondary part, the primary art comprises the first transformer winding and the first magnetic layer, which first transformer winding is constructed as a two-dimensional pattern of conductor tracks, is laminated in the printed circuit board between the first magnetic layer and tips insulation layer, and is electrically connected to the pattern of conductor tracks at the first outer surface, and the secondary part comprises the second transformer winding and a second magnetic layer, which second transformer winding lies between the second magnetic layer and the insulation layer.

2. A system as claimed in claim 1, characterized in that the secondary part forms part of the printed circuit board, such that the transformer is of a completely layered structure.

3. The system of claim 2, wherein the transformer forms part a circuit that is designed as a resonant topology.

4. A system as claimed in claim 1, characterized in that the primary part forms part of a charger device, and in that the secondary part forms part of a user device.

5. A system as claimed in claim 1, characterized in that the transformer forms part of a circuit which is designed as a resonant topology.

6. A printed circuit board provided with a first and a second, opposed outer surface, with a pattern of conductor tracks on said first outer surface, and comprising a first transformer winding and a first magnetic layer, characterized in that the first magnetic layer, the first transformer winding constructed as a two-dimensional pattern of conductor tracks, and an insulating layer are laminated between the first and the second outer surface, while the first transformer winding is connected with electrical conduction to the pattern of conductor tracks at first outer surface, and the printed circuit board is suitable for use in the system as claimed in claim 1.

7. A printed circuit board as claimed in claim 6, characterized in that at least the first magnetic layer comprises a composite of a matrix of organic material and a filler of magnetic material.

8. A printed circuit board as claimed in claim 6, characterized in that a screening layer of electrically conducting material and an intermediate layer of electrically insulating material are present at the first outer surface between the first magnetic layer and the pattern of conductor tracks.

9. A printed circuit board as claimed in claim 6, characterized in that a third transformer winding in the form of a two-dimensional pattern of conductor tracks is present between the transformer winding and the insulating layer, which third transformer winding is electrically connected to the first transformer winding.

10. A charger device provided with the printed circuit board as claimed in claim 6.

11. A user device provided with the printed circuit board as claimed in claim 6.

12. A printed circuit board as claimed in claim 6, characterized in that a second transformer winding constructed as a two-dimensional pattern of conductor tracks and a second magnetic layer are present between the insulating layer and the second outer surface, and in that the second transformer winding and the second magnetic layer are laminated together with the insulating layer, the first transformer winding, and the first magnetic layer.

13. A printed circuit board as claimed in claim 12, characterized in that the insulating layer has a thickness of at least 0.4 mm and projects at least 2.5 mm beyond the magnetic layers.

14. An apparatus provided with the printed circuit board as claimed in claim 12.

15. The printed circuit board of claim 12, wherein at least the first magnetic layer includes a composite of a matrix of organic material and a filler of magnetic material.

16. The printed circuit board of claim 12, wherein a screening layer of electrically conducting material and an layer of electrically insulating material are present ad the first outer surface between the first magnetic layer and the pattern of conductor tracks.

17. A printed circuit board as claimed in claim 12, characterized in that the insulating layer is provided with channels, which channels are filled with a composite comprising a matrix of organic material and a filler of magnetic material.

* * * * *